(12) United States Patent
Lee et al.

(10) Patent No.: US 7,975,380 B2
(45) Date of Patent: Jul. 12, 2011

(54) METHOD OF FABRICATING A PROBE CARD (75) Inventors: Oug-Ki Lee, Seoul (KR); Kyu-Hyun Shin, Seoul (KR); Seong-Hoon Jeong, Seoul (KR)

(73) Assignee: Phicom Corporation, Seoul (KR)

( * ) Notice: Subject to any disclaimer, the term of this patent is extended or adjusted under 35 U.S.C. 154(b) by 290 days.

(21) Appl. No.: 12/091,742

(22) PCT Filed: Oct. 19, 2006

(86) PCT No.: PCT/KR2006/004257
§ 371 (c)(1),
(2), (4) Date: Aug. 25, 2008

(87) PCT Pub. No.: WO2007/049878
PCT Pub. Date: May 3, 2007

(65) Prior Publication Data
US 2009/0184726 A1    Jul. 23, 2009

(30) Foreign Application Priority Data
Oct. 28, 2005    (KR) .................... 10-2005-0102408

(51) Int. Cl.
*H01R 9/00* (2006.01)
*H05K 3/00* (2006.01)
(52) U.S. Cl. ............... 29/843; 29/842; 29/847; 439/83
(58) Field of Classification Search ............ 29/832, 29/837, 839, 840, 842, 843, 852, 739; 174/260–263; 439/83
See application file for complete search history.

(56) References Cited

U.S. PATENT DOCUMENTS

| 5,508,229 | A | 4/1996 | Baker |
| 6,790,056 | B2 * | 9/2004 | Buondelmonte et al. ....... 29/739 |
| 7,024,763 | B2 * | 4/2006 | Mathieu et al. ................ 29/852 |
| 7,293,692 | B2 * | 11/2007 | Akamatsu et al. ......... 228/248.1 |
| 2002/0061668 | A1 | 5/2002 | Fujimura |

FOREIGN PATENT DOCUMENTS

| JP | 07-167892 | 7/1995 |
| JP | 2002-158264 | 5/2002 |
| JP | 2002-164104 | 6/2002 |
| JP | 2003-282656 | 10/2003 |
| KR | 10-0323657 | 1/2002 |
| KR | 10-2002-0014677 A | 2/2002 |
| WO | WO 02/15260 A1 | 2/2002 |
| WO | WO0215260 A1 | 2/2002 |

* cited by examiner

*Primary Examiner* — Donghai D. Nguyen
(74) *Attorney, Agent, or Firm* — Muncy, Geissler, Olds & Lowe, PLLC

(57) ABSTRACT

Provided is a probe card and method of fabricating the same. This method comprises forming soldering bumpers electrically connected to conductive patterns on a substrate, forming probes connected to the conductive patterns and supported by the soldering bumpers, and then melting the soldering bumpers to fixing the probes to the substrate. Forming the soldering bumpers includes a step of forming the soldering bumpers in the same pattern and size by means of a photolithography process.

7 Claims, 7 Drawing Sheets

METHOD OF FABRICATING A PROBE CARD

TECHNICAL FIELD

The present invention relates to a probe card and method of fabricating the same employed in an electronic device test apparatus.

BACKGROUND ART

Probe cards are apparatuses, each including a substrate and probes arranged on the substrate, are used for electrical characteristics of microscopic electronic devices (e.g., semiconductor devices). As well known in this art, semiconductor devices include pads formed on their surfaces for exchanging signals with external electronic systems. Semiconductor devices conduct predetermined operations with electrical signals input through pads and thereafter transfer operation results to the external electronic systems through the pads. During this, the probe cards provide electric paths between the semi-conductor devices and the external electronic systems (e.g., testers), enabling electric tests to the semiconductor devices.

In the mean time, with higher integration density of semiconductor devices, those pads are being more microscopic in dimensions and reduced even in intervals therebetween. According as that, the probe cards need to be fabricated in finer configurations in correspondence with such high integration density of semiconductor devices, but these requirements for miniaturation make fabrication processes of the probe cards more difficult. Especially, coupling processes for adhering probes, which are arranged to contact with pads of the semiconductor devices, on a probe card substrate are usually confronted by varieties of technical difficulties along the higher integration density of semiconductor devices.

There are various arts for the coupling processes, such as a soldering conducted by hand, a technique using a flip-chip bonder, and a technique using laser. The soldering by hand takes a long time, as well as a product quality is heavily dependent on skill of a worker. Further, according to the trends of miniaturation on semiconductor devices, the soldering is insufficient to accomplish the accuracy of alignment required therefor.

The technique by the flip-chip bonder is widely used nowadays, but disadvantageous to improving a product yield because just one probe fail thereof may result in an overall defect. Furthermore, since the flip-chip bonding is required of expensive equipment, it raises a cost for manufacturing a product thereof.

The coupling technique by laser includes steps of individually heating and bonding probes, so it takes a long time as like the soldering. And, as the laser coupling technique accompanies with rapidly cooling and rapidly heating probes, it would cause destruction of a product by abrupt temperature variation.

Moreover, while an adhesive is used for settling probes on a substrate of the probe card, those techniques make it difficult to precisely control configuration and bulk of the adhesive in accordance with necessity. This difficulty in controlling pattern and bulk of the adhesive may incur irregularity on height of the probes and degrade the qualities of a probe card. In particular, according to those technical ways for probe cards, since the adhesive used for fixing probes is hard to be formed in predetermined pattern and bulk all over the substrate of probe card, it is difficult to overcome such irregularity on height of the probes.

DISCLOSURE OF INVENTION

Technical Problem

The present invention is directed to provide a probe card with probes regular on height.

The present invention is also directed to provide a method of fabricating a probe card in regular height of probes.

The present invention is further directed to provide a method of fabricating a probe card, preventing destruction by variation of temperature together with shortening a time for fabricating the probe card.

The present invention is still further directed to a method of fabricating a probe card, including a step for making an adhesive, which is used to settle the probe card on a substrate, in predetermined pattern and size.

Technical Solution

In order to accomplish the technical directions, the present invention provides a method of fabricating a probe card, including a step of soldering bumpers by means of photolithography process. This method comprises the steps of: forming soldering bumpers electrically contacting connected to conductive patterns on a substrate including pluralities of the conductive patterns; disposing probes supported by the soldering bumpers and connected to the conductive patterns; and melting the soldering bumpers and fixing the probes to the substrate.

In an embodiment of the present invention, the step of forming the soldering bumpers comprises: forming a mask pattern with including openings on the substrate; forming the soldering bumpers, which are electrically connected to the conductive patterns, by using the mask pattern as a mold; and removing the mask pattern. The openings may be formed over the conductive pattern in the same pattern and size. The soldering bumpers are preferred to be formed by an electroplating process using the mask pattern as the mold.

According to the present invention, the soldering bumpers are made of at least one of materials from Sn—Pb series, Sn—Bi series, Sn—Bi series, and Sn—Zn series.

In another embodiment of the present invention, the method may be further comprised of, before forming the soldering bumpers, forming supporting bumpers that physically support the probes and are electrically connected to the conductive patterns. The supporting bumpers are preferred to be formed through a photolithography process in the same size and pattern. In more detail, the step of forming the supporting bumpers comprises: forming a supporting bumper mask pattern to expose top faces of the conductive patterns on the substrate; and forming the supporting bumpers, which are electrically connected to the conductive patterns, by means of an electro-plating process using the supporting bumper mask pattern as a mold.

According to embodiments of the present invention, the probe comprises at least one of a guide supporter and a plug, wherein the guide supporter is shaped in correspondence with patterns of the supporting bumper and/or the soldering bumper, and wherein the plug is shaped in correspondence with patterns of the supporting bumpers and substrate. The substrate comprises grooves corresponding to plugs in shape. Bottoms of the grooves are leveled lower than bottoms of the supporting bumper and/or the soldering bumper.

In order to accomplish another direction of the present invention, the present invention provides a probe card having partial melted soldering bumpers. The probe card comprises: a substrate in which pluralities of conductive patterns are formed; probes electrically connected to the conductive patterns on the substrate; and melted soldering bumpers fixing the probes to the substrate. Each probe includes a guide supporter and the melted soldering bumper is divided into pluralities of partial soldering bumpers by the guide supporter.

The melted soldering bumper is made of at least one of materials from Sn—Pb series, Sn—Bi series, Sn—Bi series, and Sn—Zn series. The probe card may further comprise supporting bumpers electrically connected to the conductive patterns and disposed between the melted soldering bumpers and the conductive patterns, physically supporting the probes.

The probe may further comprise a plug corresponding to the supporting bumpers or the substrate in shape. The guide supporter is shaped in correspondence with the supporting or soldering bumpers.

The probe card according to claim 13, wherein the substrate comprises a groove corresponding to the plug in shape, wherein the bottom of the groove is leveled lower than the bottom of the supporting or soldering bumper. In this case, the groove is formed under the center of the conductive pattern, wherein the conductive pattern has a hollow to expose the groove at the center.

Advantageous Effects

According to the present invention, a predetermined mask pattern is uses as a mold to form soldering bumpers. As the mask pattern can be made by a photography process, it is able to uniformly form the soldering bumpers in desired pattern all over a substrate. Thus, the soldering bumpers corresponding to a structure for connecting probes are formed in the same pattern and bulk all over the substrate. As a result, the probes can be arranged in uniform height all over the substrate.

In addition, according to the present invention, a heating device capable of gradually ascending or descending temperature is used to melt the soldering bumpers. Thus, the probe card according to the present invention may be fabricated without destruction by thermal stress. Further, the heating device melts or cools down the soldering bumpers all over the substrate, so that it is possible to remarkably shorten a work time rather than the techniques of adhering probes respectively to a substrate. Such reduction of the work time increases product efficiency and saves a coast for fabricating a product of probe card.

According to the present invention, supporting bumper and/or the soldering bumper are formed by way of a planarization process. Thus, even on an uneven substrate, the probes by the present invention are formed in advanced flatness.

BRIEF DESCRIPTION OF THE DRAWINGS

FIGS. 2, 4, 6, 8, 9, 10, and 12 are sectional views illustrating processing features by a method of fabricating the probe card in accordance with the first embodiment of the present invention.

BEST MODE FOR CARRYING OUT THE INVENTION

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. In the figures, like reference numerals refer to like elements throughout.

FIGS. 1, 3, 5, 7, 9, and 11 are plan views illustrating processing features by a method of fabricating a probe cared in accordance with a first embodiment of the present invention. FIGS. 2, 4, 6, 8, 9, 10, and 12 are sectional views illustrating processing features by a method of fabricating a probe cared in accordance with the first embodiment of the present invention, showing sections along the broken lines I-I' of FIGS. 1 through 11.

Figure 1:
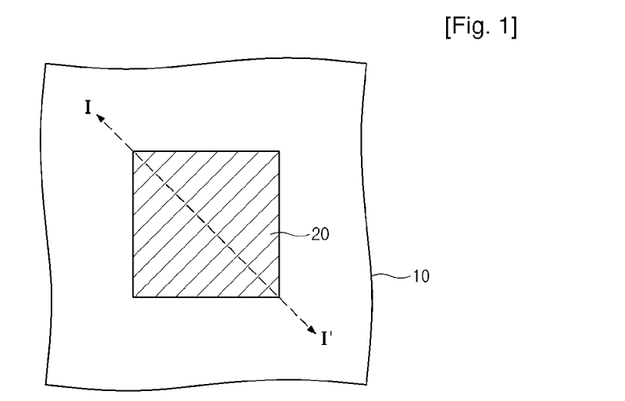
FIGS. 1, 3, 5, 7, 9, and 11 are plan views illustrating processing features by a method of fabricating a probe cared in accordance with a first embodiment of the present invention.
Figure 2:
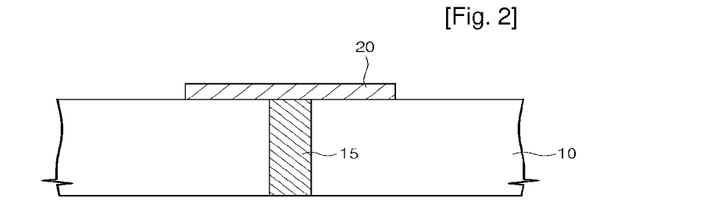

Referring to FIGS. 1 and 2, first, a substrate 10 with a pad 20 is prepared for fabricating the probe card of the present invention. The pad 10 is disposed on a side of the substrate 10, being electrically connected to a conductive pattern 15 which is formed in the substrate 10. The conductive pattern 15 is connected to an external electronic system such as a tester. The pads 20 may be located at position corresponding to dispositions of terminals (e.g., input/output pads formed in a semi-conductor device) settled in a test target. According to the present invention, a multi-level printed circuit board may be used as the substrate 10.

The pad 20 is made of at least one selected from copper (Cu), nickel (Ni), tungsten (W), gold (Au), and a composite of them. But, the pad 20 by the present invention may be formed with including at least one among other metallic materials and alloys of them.

Figure 3:
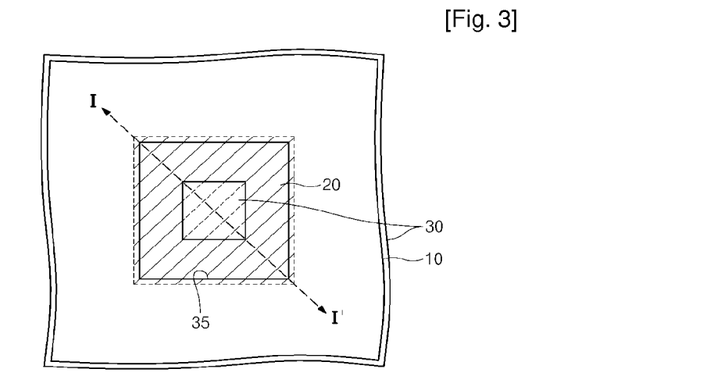
Figure 4:
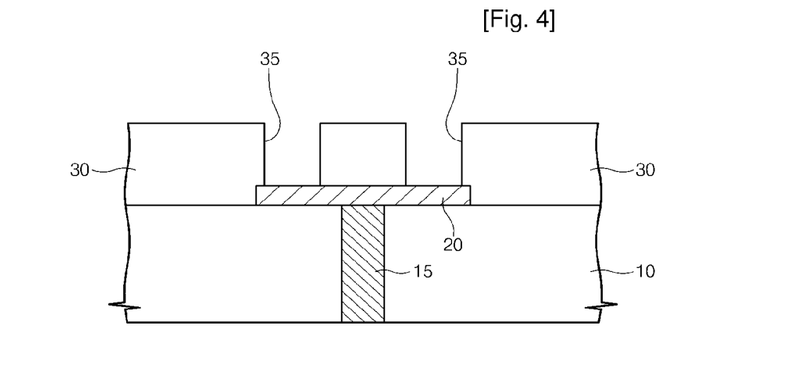

Referring to FIGS. 3 and 4, on the substrate 10 including a plurality of the pad 20, a first mask pattern 30 is arranged with including a first opening 35 that partially exposes a top face of the pad 20. The first opening 35 defines a pattern of a supporting bumper (40 shown in FIGS. 5 and 6) through the subsequent processing step. Namely, the first mask pattern 30 is used as a mode for the supporting bumper 40.

According to the present invention, it is preferred for the first mask pattern 30 to be formed of a maternal having etching selectivity to the pad 20, the substrate 10, and the supporting bumper 40. For instance, the first mask pattern 30 may be made of a photoresist pattern formed by a normal photolithography process. In this case, forming the first mask pattern 30 is carried out with including steps of depositing a photoresist film on the substrate on which the pad 20 is disposed, and then exposing the photoresist film by means of a photomask to define a position of the first opening 35. Thereafter, the exposed photoresist film is developed to complete a photoresist pattern used as the first mask pattern 30.

According to another embodiment of the present invention, before depositing the photoresist film, a mask film to be used as the first mask pattern 30 may be formed on the substrate 10 including the pad 20. In this case, the mask film is patterned by using the photoresist pattern as a mask, resulting in the first mask pattern 30.

According an embodiment of the present invention, the first mask pattern 30 is formed to cover the top center portion of pad 20 and the substrate around the pad 20. Namely, the first opening 35 may be formed to cover the top edge of the pad 20, as shown in FIGS. 3 and 4. The pattern of the opening 35 in accordance with the present invention is not restrictive hereto as illustrated, but may be modifiable in various configurations.

Figure 5:
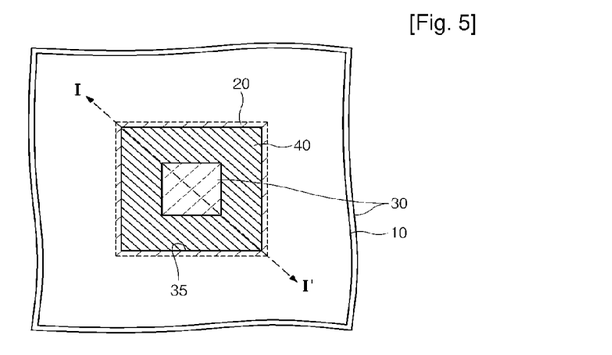
Figure 6:
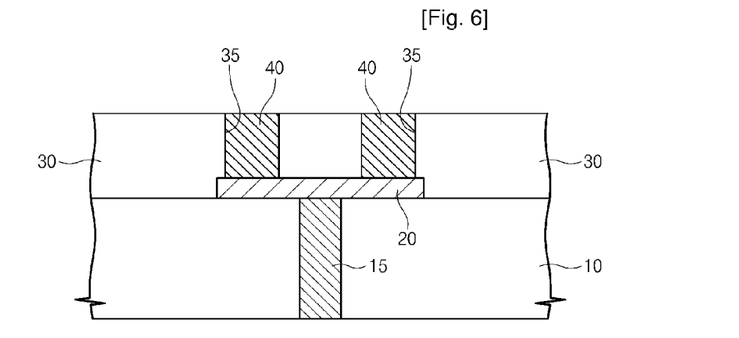

Referring to FIGS. 5 and 6, a supporting bumper 40 is formed to contact with the pad 20, filling the first opening 35. Forming the supporting bumper 40 may be carried out with including steps of depositing a supporting bumper film to fill the first opening 35 on the first mask pattern 30, and then etching to flatten the supporting bumper film until exposing the top of the first mask pattern 30. As like this, since the supporting bumper 40 is formed by using the fist mask pattern 30 as a mold therefor, it is preferred to be set in the same configuration and bulk all over the substrate 10. This feature of the present invention enables probes to be settled all over the substrate in the same height.

The supporting bumper is preferred to be made of a conductive material having strong adhesion to the pad 20. For instance, the supporting bumper may be formed of at least one selected from copper (Cu), nickel (Ni), tungsten (W), and an alloy of them. But, the supporting bumper 40 by the present invention may be formed with including at least one among other metallic materials and alloys of them.

Further, the supporting bumper 40 may be formed by means of electro-plating technology. In more detail, after forming a seed layer (not shown) contacting with the pad 20 on the substrate 10, an electro-plating process utilizing the seed layer as an electrode is carried out to form the supporting bumper 40 filling the first opening 35. During this the seed layer is generated by means of a sputtering technique that deposits any source material. It is preferred for the seed layer to be formed as a copper film.

A step of etching the supporting bumper film is preferred to use the etching selectivity to the first mask pattern 30. According to an embodiment of the present invention, the step of etching the supporting bumper film may be carried out by using one of chemical-mechanical polishing (CMP), mechanical polishing, wet etch-back, and dry etch-back. Especially, even if the top face of the substrate 10 is uneven, the top face of the supporting bumper 40 becomes flattened through etching the supporting bumper film by means of CMP. As a result, probes disposed by the subsequent processing step are leveled with each other regardless of the flatness on the substrate 10.

Figure 7:
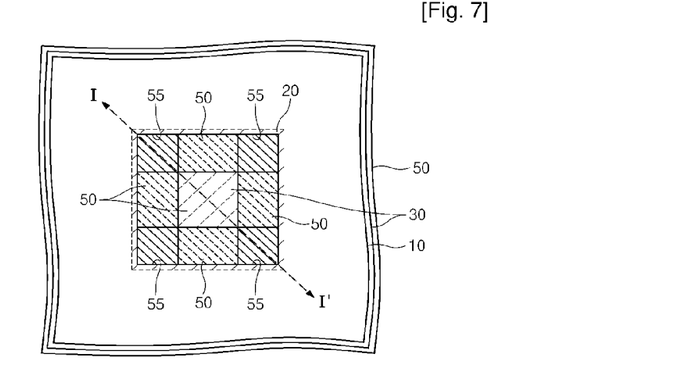
Figure 8:
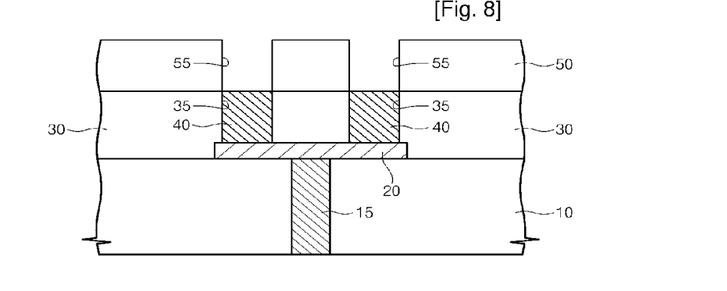

Referring to FIGS. 7 and 8, a second mask pattern 50 is formed on the resultant structure including the supporting bumper 40. The second mask pattern 50 is arranged to define second openings 55 that expose the top of the supporting bumper 40. The second openings 55 define patterns of soldering bumpers 60 in the subsequent processing step. The second mask pattern 50 is used as a mold for the soldering bumpers 60. Thus, the soldering bumpers 60 are formed all over the substrate 10 in the same pattern.

According to the present invention, it is preferred for the second mask pattern 50 to be formed of a maternal having etching selectivity to the pad 20, the substrate 10, the supporting bumper 40, and the soldering bumpers 60. For instance, the second mask pattern 40 may be made of a photoresist pattern formed by a normal photolithography process. In this case, forming the second mask pattern 50 is carried out with including steps of depositing a photoresist film on the substrate on which the supporting bumper 40 is disposed, and then exposing the photoresist film by means of a photomask to define positions of the second openings 55. Thereafter, the exposed photoresist film is developed to complete a photoresist pattern used as the second mask pattern 50.

The second openings 55 are formed to partially expose the top of the supporting bumper 40. According to an embodiment of the present invention, the supporting bumper 40 is exposed by pluralities of the second openings 55 which are separated from each other. For example, the second openings 55, as illustrated, partially expose the supporting bumper 40 at the four corners of the first opening 35. As a result, over the pad 20 and the supporting bumper 40, the second mask pattern 50 is formed in a shape of the cross.

In the meantime, according to a modified embodiment of the present invention, the second mask pattern 50 may be arranged to overlap with the first mask pattern 30. Namely, the second mask pattern 50 is formed on the top center of the pad 20 and the substrate 10 around the pad 20. In other words, the second openings 55 are formed to expose the top faces of the supporting bumper 40. The exposed top faces of the supporting bumper 40 are not isolated by the second mask pattern 50. In this point, the first and second mask patterns 40 and 50 can be formed through a lithography process using the same photomask. During this, in purpose of preventing misalignment that the second openings 55 stray from the supporting bumper 40, the second opening 55 is preferred to be smaller than the first opening 35 in width. For this, the second mask pattern 50 may be formed by means a photoresist re-flow process. The photoresist re-flow process includes a step of heating the second mask pattern 50 up to predetermined temperature in order to extend a width of the second mask pattern 50. As like the first opening 35, the second openings 55 are modifiable in various positions and patterns without being restrictive to the aforementioned embodiments.

Figure 9:
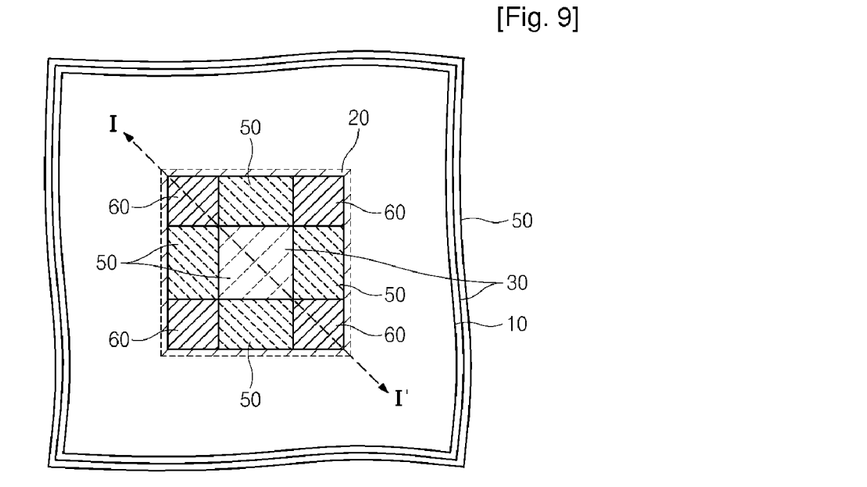
Figure 10:
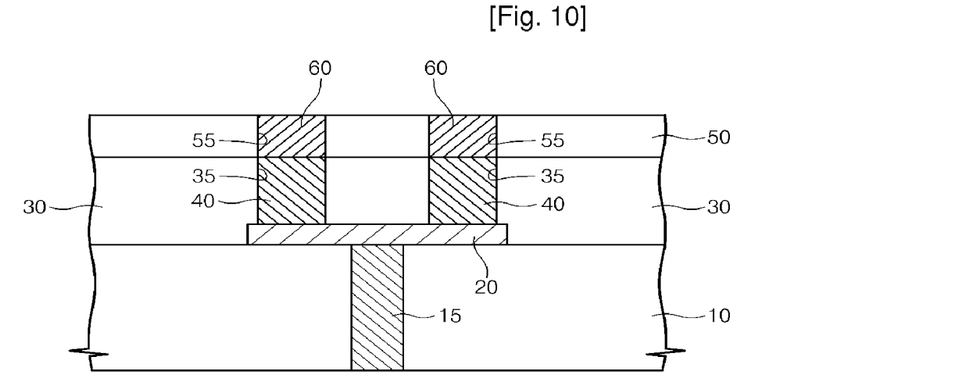

Referring to FIGS. 9 and 10, the soldering bumpers 60 are formed to contact with the supporting bumper 40, filling the second openings 55. Forming the soldering bumpers 60 may be carried out with including steps of depositing a soldering bumper film to fill the second openings 55 on the second mask pattern 50, and then etching the soldering bumper film until exposing the top of the second mask pattern 50. As like this, since the soldering bumpers 60 are formed by using the second mask pattern 50 as a mold therefor, they are set in the same configuration and bulk all over the substrate 10. This feature of the present invention enables probes to be settled all over the substrate in the same height.

According to the aforementioned embodiment of the present invention, since the second openings 55 expose the supporting bumper 40 on the four corners of the first opening 35, the soldering bumpers 60 formed by the mold of the second mask pattern 50 contact with on the four corners of the first opening 35. The soldering bumpers 60 may be composed of partial soldering bumpers divided by the second mask pattern 50. Further, according to the modified embodiment of the present invention, as the second mask pattern 50 is arranged on the position overlapping with the first mask pattern 30, the soldering bumpers 60 formed by the mold of the second mask pattern 50 can be formed in the same pattern of the supporting bumper 40.

It is preferred for the soldering bumper film to be made of a conductive material having higher adhesive strength to the supporting bumper 40 and a lower melting point. Here, the melting point of the soldering bumper film is preferred to be set in the range of temperature (e.g., 130 through 230° C.) not to vary physical characteristics and structures of the supporting bumper 40, the pad 20, the substrate 10, and the conductive pattern 15. For this, the soldering bumper film may be made of at least one of materials belonging to Sn—Pb series, Sn—Bi series, Sn—Ag series, and Sn—Zn series (those melting points are about 183° C., 141° C., 223° C., and 198° C., respectively, in order).

The soldering bumper film may be also formed an electroplating technique. In more detail, after forming a seed layer contacting with the supporting bumper 40 on the substrate 10, an electro-plating process utilizing the seed layer as an electrode is carried out to form the soldering bumpers 60 filling the second openings 55. During this the seed layer is generated by means of the sputtering technique.

Meanwhile, according to anther embodiment of the present invention, a step of forming the soldering bumpers 60 is carried out with using the supporting bumper 40 as a seed layer. In further detail, the seed layer for the supporting bumper 40 is used as the electrode for generating the soldering bumper film. In this case, since there is no need of a step for forming an additional seed layer, it is able to simplify a fabrication process and to reduce a cost for manufacturing.

A step of etching the soldering bumper film is preferred to use the etching selectivity to the second mask pattern 50. According to an embodiment of the present invention, the step of etching the soldering bumper film may be carried out by using one of chemical-mechanical polishing (CMP), mechanical polishing, wet etch-back, and dry etch-back.

Figure 11:
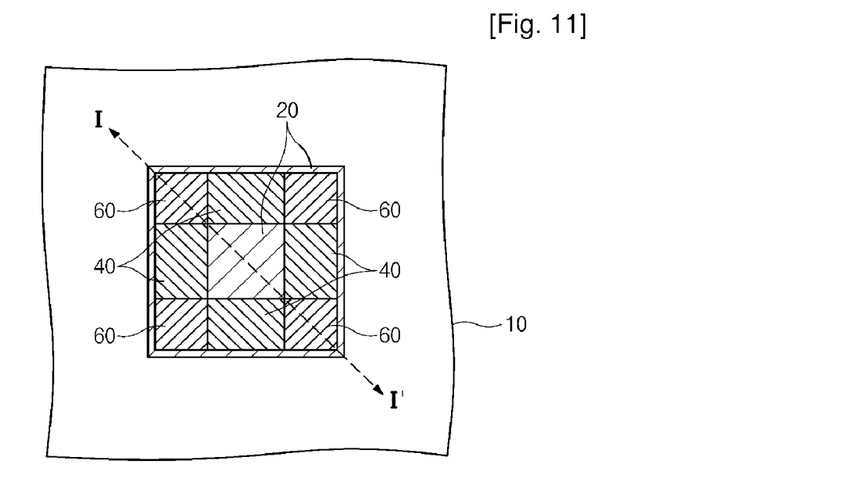
Figure 12:
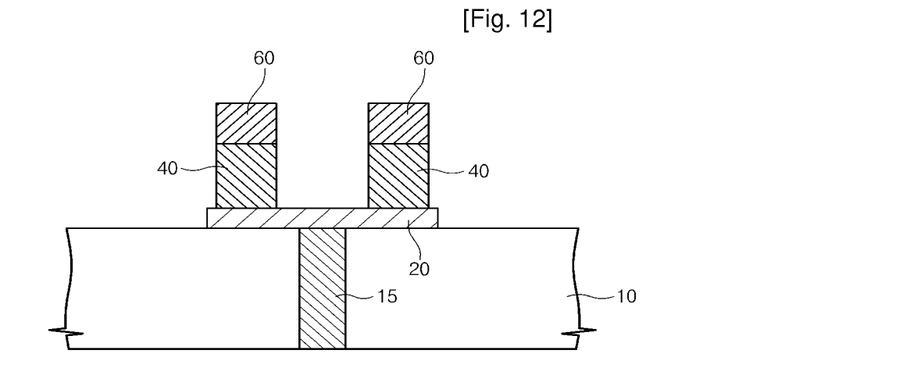

Referring to FIGS. 11 and 12, the second and first mask patterns 50 and 30 are sequentially removed to expose the substrate 10 around the pad 20. As a result, the supporting bumper 60 is laid on the pad 20 and the soldering bumpers 60 are set on the supporting bumpers 60.

According to the aforementioned embodiment, the pad 20 is completed in a shape of plate with a predetermined thickness and the supporting bumper 40 is completed in a shape of hollow that exposes the center of the pad 20. Further, the soldering bumpers 60 are exposed on the four corners of the supporting bumper 40 each by each. As a result, the top face of the supporting bumper 40 has portions exposed among the four corners of the soldering bumpers 60 (see FIG. 13). Additionally, the aforementioned embodiment modified by the present invention, each of the soldering bumpers 60 may be formed in the same shape with the supporting bumper 40.

The step of removing the first and second patterns 30 and 50 is preferred to use an etching recipe having selectivity to the soldering bumper 60, the supporting bumper 40, the pad 20, and the substrate 10. As aforementioned, if the first and second mask patterns 30 and 50 are made up with photoresist patterns, the etching process can be conducted by means of a normal photoresist striping technique.

Figure 13:
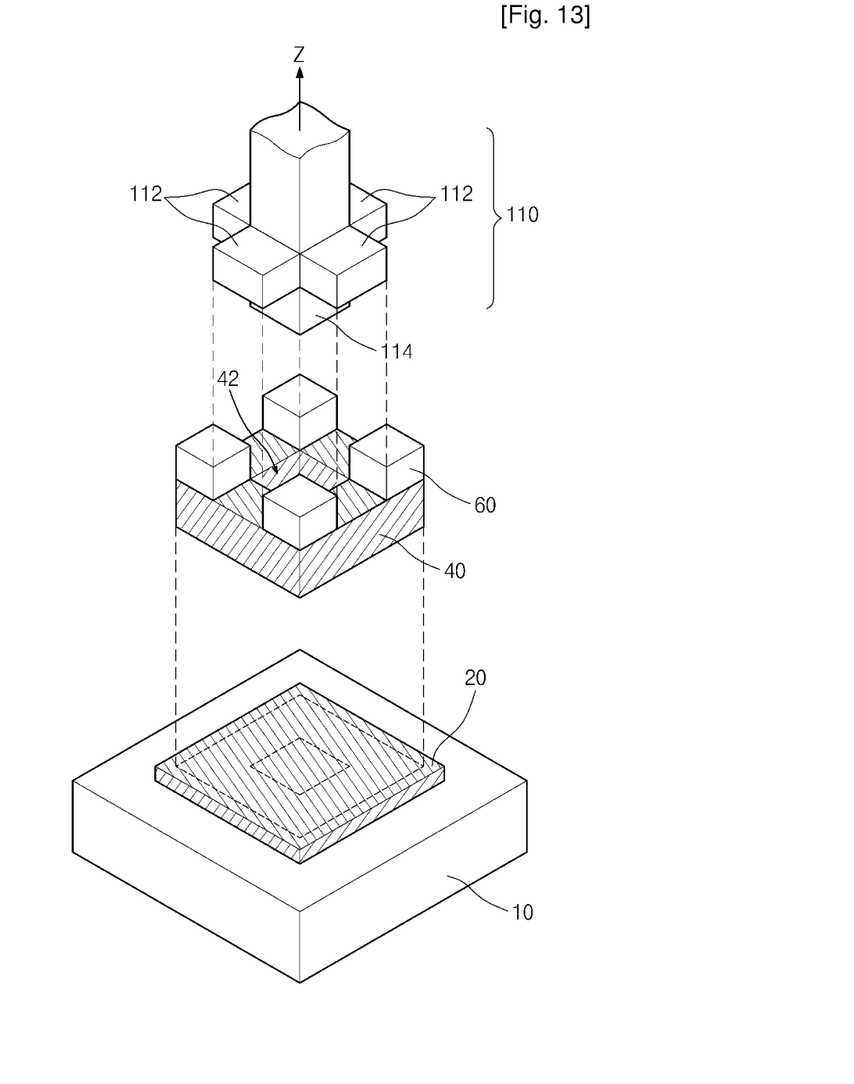
FIG. 13 is a perspective view illustrating a structure of the probe card in accordance with the first embodiment of the present invention.

After then, referring to FIG. 13, probes fabricated by an additional process are adhered on the substrate 10 including the soldering bumpers 60. The probe is composed of a tip (not shown) directly contacting with a pad of the semiconductor device, and a connector 110 linking with the pad 20 on the substrate 10. The probe is usually classified into vertical and cantilever types in accordance with operating point of the force applied thereto when the tip is contacting with an input/output pad of the semi-conductor device. The vertical probe works with an operating point of force on the Z-axis of the connector 110, whereas the cantilever probe works with an operating point of force out of the Z-axis of the connector 110. Hereinafter will be described the present invention relevant to a structure of the connector 110, but it is not restrictive to structure and position of the tip in the point that each of the probes is equipped with the connecter 110. Therefore, the present invention is adoptable to both the vertical and cantilever probes.

According to the present invention, for strong coupling and stable electrical connection between the probe and the substrate 10, the connector 110 of the probe is alterable or modifiable into various structures. For instance, as shown in FIG. 13, the connector 110 comprises guide supporters 112 protruding toward directions rectangular to the Z-axis, and a plug 114 protruding along the axis of the connector 110. The guide supporters 112 are inserted between the soldering bumpers 60, contacting with the top of the supporting bumper 40. Namely, the guide supporters 112 are disposed between the partial soldering bumpers. The plug 114 is inserted into an opening 42 of the supporting bumper 40, the opening 42 exposing the center of the pad 20. The plug 114 is preferred to directly contact with the pad 20 through the opening 42.

Then, the substrate 10 on which the probe is disposed is loaded into a heating device that gradually ascends or descends internal temperature. The heating device operates to heat the soldering bumpers 60 over the melting point and cools them down. Thus, the connector 110, i.e., the guide supporters 112, adheres to the supporting bumper 40 and the substrate 10.

Meantime, the gradual heating-up and cooling-down may act to minimize thermal stress to the probe card of the present invention, so it contributes to reducing the probability of product destruction by thermal stress arising from the laser-used process. Further, since the heating device melts and cools down the soldering bumpers 60 all over the substrate, it is possible to remarkably shorten a work time rather than conventional techniques to adhere each probe individually to the substrate of the probe card. Such reduction of the work time enlarges the efficiency of manufacturing a product of probe card and curtails a cost for manufacturing the product of probe card.

Figure 14:
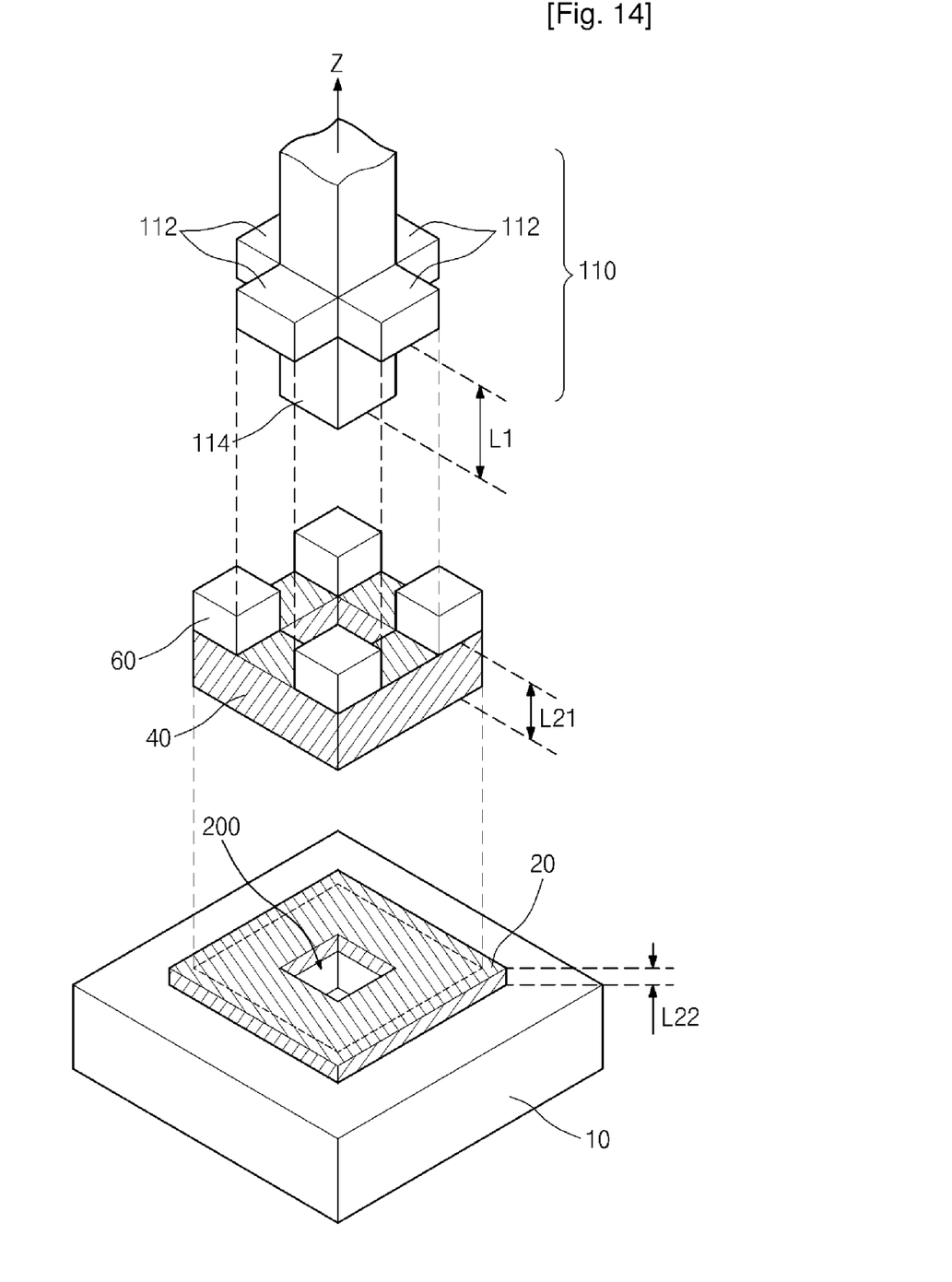
FIGS. 14 through 16 are perspective views illustrating probe cards in accordance with other embodiments of the present invention.
Figure 15:
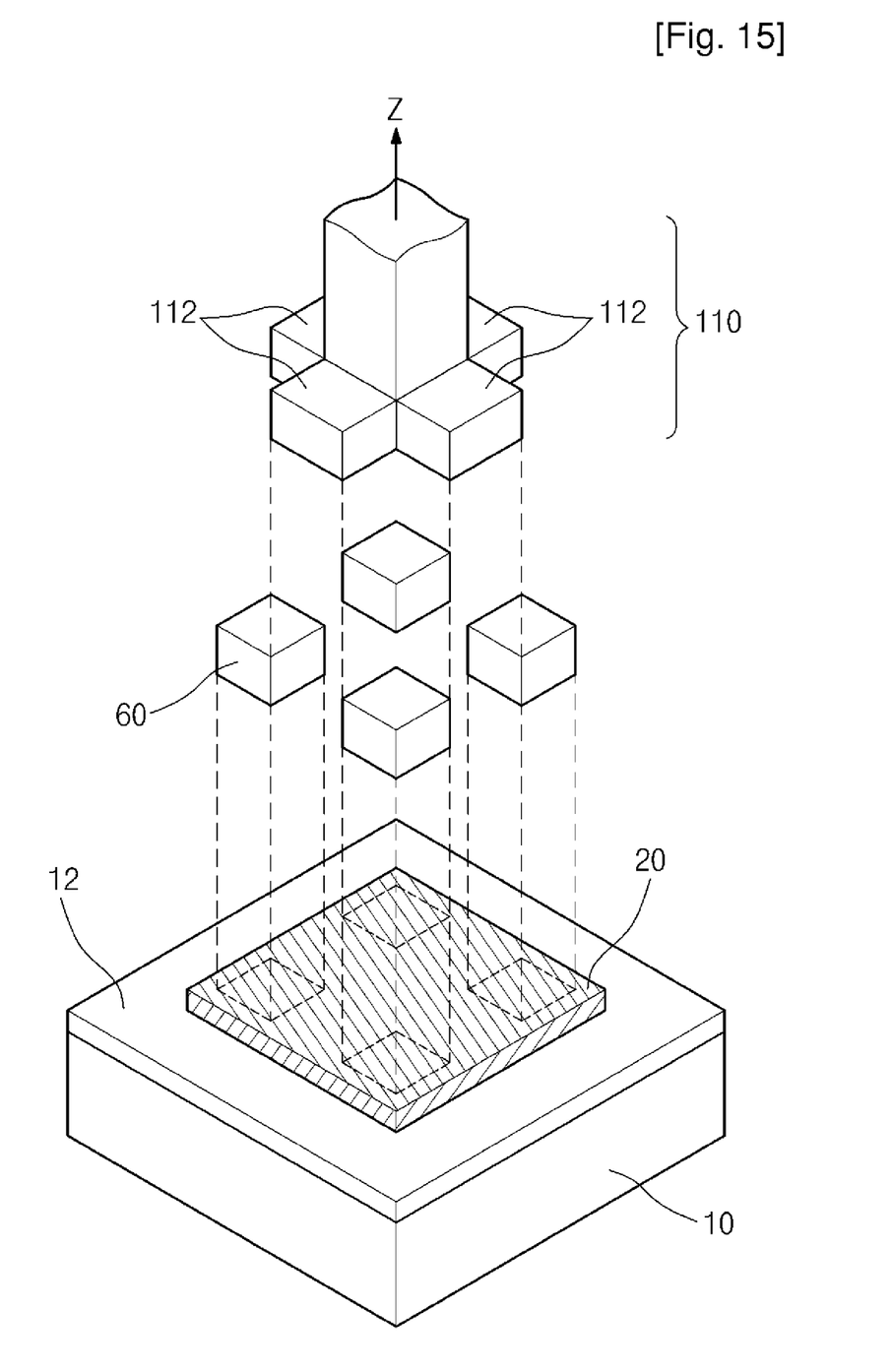
Figure 16:
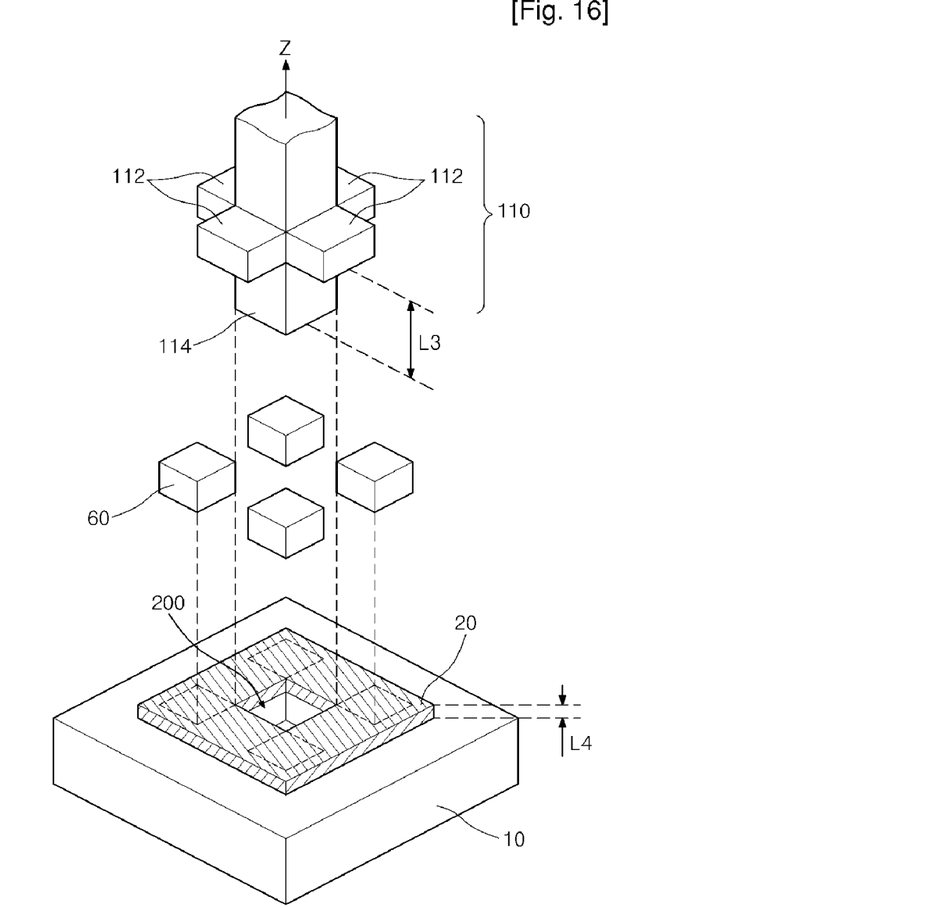

According to the present invention, the supporting bumper 40, the soldering bumpers 60, the pad 20, and the substrate 10 may be variable in accordance with a structure of the connector 110 of the probe. FIGS. 14 through 16 are perspective views illustrating probe cards in accordance with other embodiments of the present invention. For convenience in description, the aforementioned explanations overlapping with the followings will not be described further.

Referring to FIG. 14, the plug 114 penetrates the supporting bumper 40 and the pad 20, contacting directly with the substrate 10. It is preferred for a length (L1) of the plug 114 to be larger than or equal to a sum (L21+L22) of thickness of the supporting bumper 40 and the pad 20. When the plug length L1 is larger than the thickness sum L21+L22, the plug 114 can be inserted into the substrate 10. For this insertion of the plug 114, the substrate 10 comprises a groove 200 constructed in a depth of L1−L21−L22 that corresponds to a gap between the plug length L1 and the thickness sum L21+L22. Such insertion of the plug 114 into the groove 200 of the substrate 10 makes the plug 114 more stably fixed to the substrate 10 in structure.

Referring to FIG. 15, the probe card may be provided without the supporting bumper 40. In this case, the connector 110 of the probe comprises plural guide supporters 112. Each guide supporter is inserted between the soldering bumpers 60 as shown in FIGS. 13 and 14, contacting with the pad 20. According to this, the probe is supported by the soldering bumpers 60 in structure.

In this embodiment, as the soldering bumpers 60 are formed by the mold of the second mask pattern 50, the pattern of the soldering bumpers 60 is variable by the technical feature of the present invention. Namely, according to the present invention, the soldering bumpers 60 may be formed in the pattern capable of substituting for the supporting bumper 40 that functions to align and support the probe in structure. This transformation of the soldering bumper is permissible by the feature that the soldering bumpers 60 are formed from the mold of the second mask pattern 50. According to this embodiment, since it may omit the processing step of forming the supporting bumper 40, it is possible to obtain an effect of reducing a product cost by process simplification.

Meanwhile, according to a modified embodiment of the present invention, an insulation (or dielectric) film 12 may be formed to cover the top face of the substrate 10 around the pad 20. The insulation film 12 is preferred to be a silicon oxide film formed through chemical vapor deposition. According to the present invention, as aforementioned, the soldering bumpers 60 are made of at least one material from Sn—Pb series, Sn—Bi series, Sn—Ag series, and Sn—Zn series. In this case, the soldering bumpers 60 are confined in the predetermined regions (i.e., on the top faces of the pad 20 between the guide supporters 114), not spreading out of the pad 20 during the melting step. This confined disposition contributes to preventing electrical short circuits with the probes due to horizontal extension of the soldering bumpers 60, because of material characteristics that the material used for the soldering bumpers 60 is not formed on the insulation film 12 during the melting step.

Referring to FIG. 16, the connector 110 of the probe, as aforementioned in conjunction with FIG. 14, may be comprised of the plug 114 to be inserted into the substrate 10. According to this embodiment, a length L3 of the plug 114 is larger than or equal to a thickness L4 of the pad 20. When the length L3 of the plug 114 is larger than the thickness L4 of the pad 20, the plug 114 can be inserted into the substrate 10. For this, the groove 200 is provided to the substrate 10 in a depth L3-L4 corresponding to a gap between the plug length L3 and the pad thickness L4. As such, the plug 114 is inserted into the groove 200 of the substrate 10, more stably fixed to the substrate 10.

Figure 17:
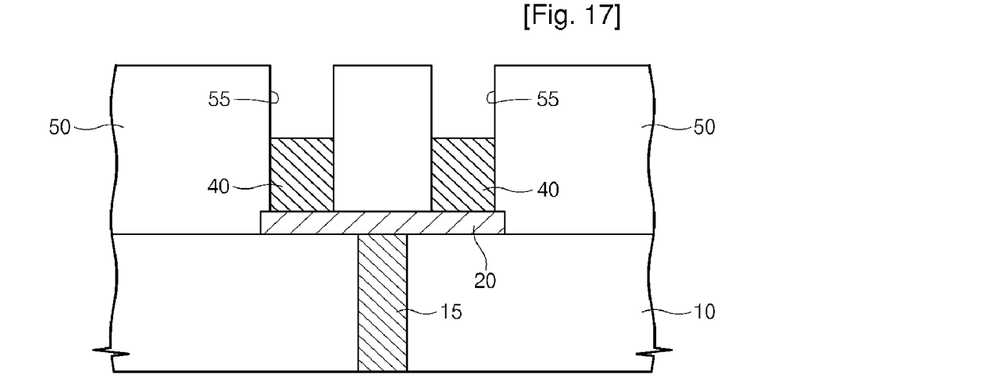
FIG. 17 is a sectional view illustrating a feature by a method of fabricating a probe cared in accordance with a modified embodiment of the present invention.

In the meantime, according to another modified embodiment of the present invention as shown in FIG. 17, after forming the supporting bumper 40, the first mask pattern 30 is removed and then the second mask pattern 50 is further arranged on the resultant structure. During this, the second mask pattern 50 and the second openings 55 may be also formed through the same manner with the aforementioned embodiment.

INDUSTRIAL APPLICABILITY

The present invention is applicable to probe cards and method of fabricating the same for electronic device testing systems. For example, the present invention may be utilized in testing semiconductor devices.

The invention claimed is:

1. A method of fabricating a probe card, comprising:
   forming soldering bumpers on a substrate including a plurality of conductive patterns, the soldering bumpers electrically connected to the conductive patterns and having a gap portion for an insertion of a probe for testing semiconductor devices;
   inserting the probe for testing semiconductor devices into the gap portion, the probe being physically supported by the soldering bumpers and connected to the conductive patterns; and
   melting the soldering bumpers to fix the probe into the substrate,
   wherein before forming the soldering bumpers, forming supporting bumpers that physically support the probes and are electrically connected to the conductive patterns, and wherein the supporting bumpers are formed through a photolithography and etching processes in a single effort.

2. The method according to claim 1, wherein forming the soldering bumpers comprises:
   forming a mask pattern with openings on the substrate;
   forming the soldering bumpers, which are electrically connected to the conductive patterns, by using the mask pattern as a mold; and
   removing the mask pattern to form the gap portion,
   wherein the openings are formed over the conductive pattern.

3. The method according to claim 2, wherein the soldering bumpers are formed by an electro-plating process using the mask pattern as the mold.

4. The method according to claim 1, wherein the soldering bumpers are made of at least one of materials from Sn—Pb series, Sn—Bi series, Sn—Ag series, and Sn—Zn series.

5. The method according to claim 1, wherein forming the supporting bumpers comprises:
   forming a supporting bumper mask pattern to expose top faces of the conductive patterns on the substrate; and
   forming the supporting bumpers, which are electrically connected to the conductive patterns, by means of an electro-plating process using the supporting bumper mask pattern as a mold.

6. The method according to claim 1,
   wherein the probe comprises at least one of a guide supporter and a plug,
   wherein the guide supporter is shaped in correspondence with pattern of the supporting bumper or soldering bumper, and
   wherein the plug is shaped in correspondence with pattern of the supporting bumper or the substrate.

7. The method according to claim 6, wherein the substrate comprises grooves having a shape corresponding to a pattern of the plug,
   wherein a bottom surface of the groove is leveled lower than a bottom surface of the supporting bumper or the soldering bumper.

* * * * *